United States Patent
Dyer

(10) Patent No.: US 8,964,578 B2
(45) Date of Patent: Feb. 24, 2015

(54) OVERLOAD PROTECTION OF A TRANSFORMER LOADED LINE DRIVER

(75) Inventor: Kenneth C. Dyer, Davis, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 485 days.

(21) Appl. No.: 13/087,027

(22) Filed: Apr. 14, 2011

(65) Prior Publication Data

US 2011/0193536 A1    Aug. 11, 2011

Related U.S. Application Data

(62) Division of application No. 12/012,725, filed on Feb. 1, 2008, now abandoned.

(60) Provisional application No. 60/900,180, filed on Feb. 7, 2007.

(51) Int. Cl.
*H04L 12/26* (2006.01)
*H04B 3/32* (2006.01)
*G06F 1/10* (2006.01)
*H03L 7/00* (2006.01)
*H04J 3/06* (2006.01)

(52) U.S. Cl.
CPC .. *H04B 3/32* (2013.01); *G06F 1/10* (2013.01); *H03L 7/00* (2013.01); *H04J 3/0697* (2013.01)
USPC .......................................................... 370/252

(58) Field of Classification Search
None
See application file for complete search history.

(56) References Cited

U.S. PATENT DOCUMENTS

| | | | | |
|---|---|---|---|---|
| 3,789,146 A * | 1/1974 | Major | ............ | 370/241 |
| 3,919,685 A * | 11/1975 | Haill | ............... | 367/65 |
| 4,153,882 A * | 5/1979 | Fisher et al. | .................... | 330/10 |
| 4,389,694 A * | 6/1983 | Cornwell, Jr. | .................. | 361/48 |
| 4,688,268 A * | 8/1987 | Holland | ....................... | 398/209 |
| 5,305,109 A * | 4/1994 | Harford | ...................... | 348/737 |
| 5,386,590 A * | 1/1995 | Dolan | .......................... | 455/557 |
| 5,436,933 A * | 7/1995 | Andruzzi, Jr. | ................ | 375/345 |
| 5,539,771 A * | 7/1996 | Noda et al. | ..................... | 375/219 |
| 5,727,006 A | 3/1998 | Dreyer et al. | | |
| 5,768,301 A | 6/1998 | Dreyer et al. | | |
| 6,064,326 A * | 5/2000 | Krone et al. | ................... | 341/143 |
| 6,178,161 B1 * | 1/2001 | Terry | .......................... | 370/276 |
| 6,351,509 B1 * | 2/2002 | Vitenberg et al. | ............. | 375/377 |
| 6,400,772 B1 * | 6/2002 | Chaplik | ......................... | 375/258 |
| 6,466,989 B1 | 10/2002 | Chu et al. | | |
| 6,782,096 B1 * | 8/2004 | Bremer et al. | ........... | 379/399.01 |
| 6,823,028 B1 * | 11/2004 | Phanse | ......................... | 375/345 |
| 6,982,557 B1 | 1/2006 | Lo et al. | | |
| 7,215,763 B1 * | 5/2007 | Keller et al. | ............. | 379/399.01 |
| 7,668,624 B2 * | 2/2010 | Heber et al. | .................. | 700/286 |
| 2002/0196863 A1 * | 12/2002 | Kaku et al. | ..................... | 375/285 |

(Continued)

OTHER PUBLICATIONS

"Non Final Office Action in U.S. Appl. No. 12/284,959", mailed by the U.S. Patent Office on Nov. 21, 2011.

(Continued)

*Primary Examiner* — Steven H Nguyen
(74) *Attorney, Agent, or Firm* — Dorsey & Whitney LLP

(57) ABSTRACT

A line driver circuit an method for protecting the line driver circuit from overdrive that includes generating an output signal for a transformer coupled to a load, and comparing a voltage of the output signal to a threshold voltage value. If the comparison indicates overload, the method further includes generating a control signal to reduce an amplitude of the output signal.

20 Claims, 2 Drawing Sheets

(56) References Cited

U.S. PATENT DOCUMENTS

| | | |
|---|---|---|
| 2003/0227966 A1* | 12/2003 | Im .................................. 375/222 |
| 2004/0208652 A1* | 10/2004 | Nagatomo et al. ............ 398/210 |
| 2004/0258236 A1* | 12/2004 | Bremer et al. ........... 379/399.01 |
| 2005/0243903 A1 | 11/2005 | Agazzi |
| 2006/0034359 A1* | 2/2006 | Hauptmann et al. .......... 375/222 |
| 2007/0081551 A1* | 4/2007 | Oishi et al. .................... 370/463 |
| 2007/0165426 A1* | 7/2007 | Kyono ....................... 363/21.02 |
| 2008/0043992 A1* | 2/2008 | Hurwitz ........................ 379/386 |
| 2009/0225648 A1 | 9/2009 | Gopalapuram et al. |
| 2009/0259893 A1 | 10/2009 | Gopalapuram et al. |

OTHER PUBLICATIONS

"Response to Non Final Office Action in U.S. Appl. No. 12/284,959", electronically filed with the U.S. Patent Office on Feb. 14, 2012.

"U.S. Patent Office Final Rejection", Co-Pending U.S. Appl. No. 12/284,959, issued Mar. 8, 2012.

\* cited by examiner

OVERLOAD PROTECTION OF A TRANSFORMER LOADED LINE DRIVER

CROSS-REFERENCE TO RELATED APPLICATION(S

This application is a divisional of pending U.S. application Ser. No. 12/012,725, filed Feb. 1, 2008, which claims priority to provisional application No. 60/900,180, filed Feb. 7, 2007. These prior applications are incorporated herein by reference, in their entirety, for any purpose.

FIELD OF THE INVENTION

The invention relates generally to electronic communication systems. More particularly, the invention relates to a training pattern to enable recognition of proper wire-pair orientation and correction in electronic communication systems.

BACKGROUND

In Ethernet 10GBase-T cabling, the data is sent over four pairs of wires. Between the transmitter and receiver, the pairs can be swapped with each other, and the wires in a pair can be swapped. These reconfigurations can result in an inverted signal or the latency of the four pairs can differ. 10GBASE-T, or IEEE 802.3an-2006, is a standard to provide 10 gigabit/second connections over conventional unshielded or shielded twisted pair cables, over distances up to 100 m. This standard mandates specific training patterns to enable recognition of the proper correction, but does not provide a means to find the proper corrections from all the possibilities. Accordingly, there is a need to develop an algorithm to efficiently search the possible corrections and identify the correct one.

SUMMARY OF THE INVENTION

A line driver circuit and a method for protecting the line driver circuit from overdrive. An exemplary method for protecting the line driver circuit from over drive includes generating an output signal for a transformer coupled to a load, and comparing a voltage of the output signal to a threshold voltage value. If the comparison indicates overload, the method further includes generating a control signal to reduce an amplitude of the output signal. An exemplary line driver circuit may include an output transistor on an integrated circuit chip. The output transistor is configured to provide an output signal to a transformer coupled to a load. The exemplary line driver circuit further includes an overload detector circuit on the integrated circuit chip that is configured to receive the output signal and compare a voltage of the output signal to a threshold voltage value. If the comparison indicates overload, generate a control signal to reduce an amplitude of the output signal.

BRIEF DESCRIPTION OF THE DRAWINGS

FIG. 1 is an exemplary block diagram of a line driver, according to an embodiment of;

DETAILED DESCRIPTION

Details of various embodiments of the present invention are disclosed in the following appendices:

Appendix A.
Appendix B.
Appendix C

Figure 1:
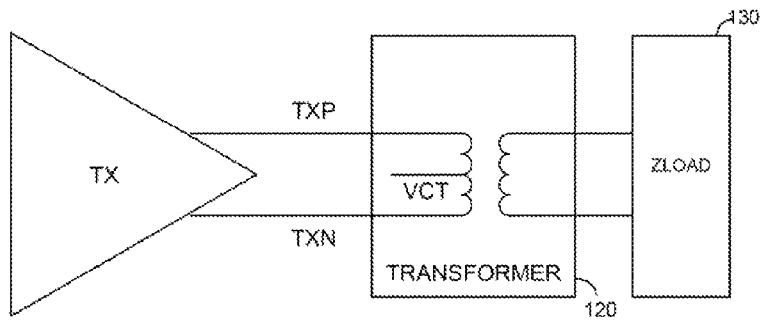
Figure 2:
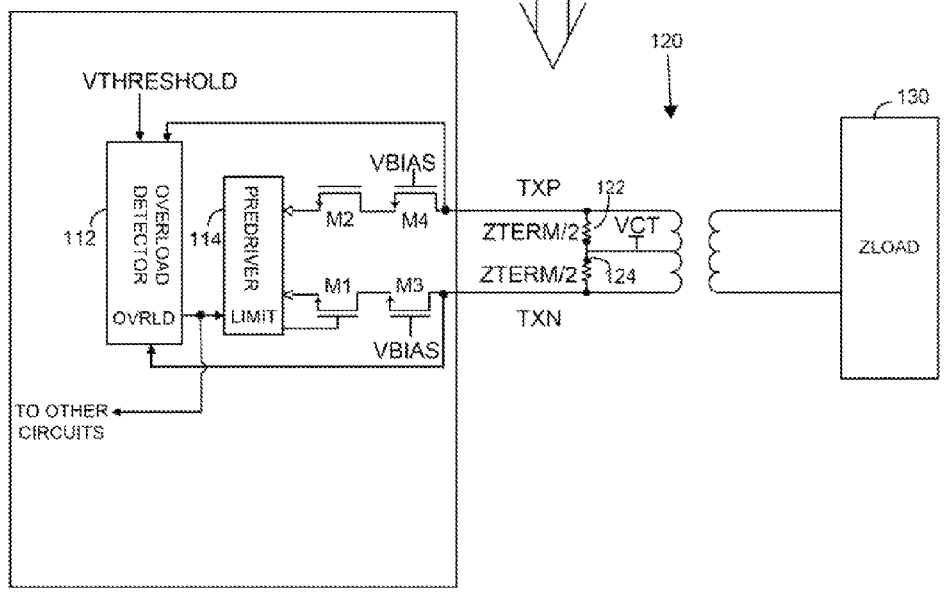
FIG. 2 is an exemplary block diagram of a line driver.

FIGS. 1 and 2 depict an output overload protection scheme for a line-driver 110 that does not require any external components for reliable operation. The line driver 110 is coupled to an external load ZLOAD 130 via a transformer 120.

The line driver 110 may include a predriver 114 configured to provide output signal TXP to a first line via transistors M2 and M4 and output signal TXN to a second line via transistors M1 and M3. The predriver 114 is coupled to respective gates and respective sources of the M1 and M2 transistors. The gates of the M3 and the M4 transistors are coupled to a bias voltage VBIAS. The M2 and the M4 transistors are coupled in series, with a drain of the M2 transistor coupled to a source of the M4 transistor, the TXP signal provided from a drain of the M4 transistor. The M1 and the M3 transistors are coupled in series, with a drain of the M1 transistor coupled to a source of the M3 transistor, the TXN signal provided from a drain of the M3 transistor. The predriver 114 is also configured to receive an overload signal.

The line driver circuit 110 further includes an overload detector 112 coupled to the predriver circuit 114. The overload protection circuit 112 is configured to receive a Vthreshold signal and the TXP and TXN signals, and to provide the overload signal to the predriver circuit 114 and to other circuitry.

The transformer 120 may include termination resistors 122 and 124 coupled in series between the first line and the second line. A center tap of the primary coil of the transformer 120 may be coupled to a node between the termination resistors Zterm/2 122 and 124, and may be held at a center tap voltage VCT.

Figure 3:
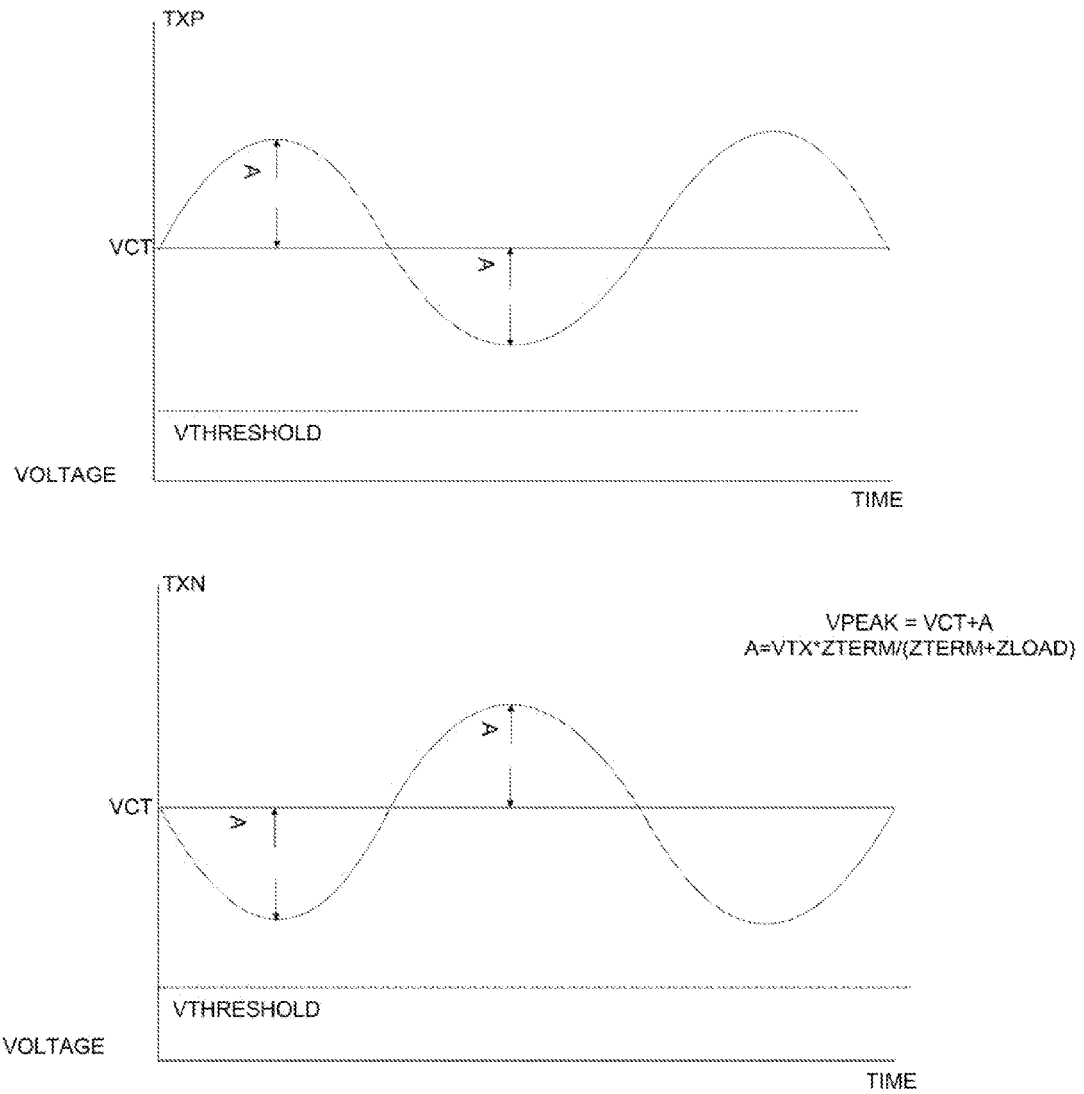
FIG. 3 depicts an exemplary graph of transmission signals from a line driver circuit.

FIG. 3 depicts the TXP and the TXN signals. As depicted in FIG. 3, the TXP and the TXN signals are complementary to one another. Thus, when the TXP signal has a maximum amplitude of "A" above the VCT voltage, the TXN signal has a maximum amplitude of "A" below the VCT voltage. Additionally, when the TXN signal has a maximum amplitude of "A" above the VCT voltage, the TXN signal has a maximum amplitude of "A" below the VCT voltage. The Vthreshold is less than the VCT.

In operation, the overload detector 112 monitors the TXP and the TXN signals. If either the TXP or the TXN signal go below Vthreshold, the overload detector 112 triggers and reduces the transmit amplitude. This is particularly important when the transmitter is transmitting into an open circuit. If Zload 130 is equal to Infinity (open load), then the transmit amplitude will double, causing stress on the output transistors and reducing the lifetime of the part. This invention detects this overload condition and protects the line-driver 110 output transistors. One aspect of this invention is that only one threshold is used and it is easy to implement on the chip.

In some cases, the VCT can be equal to the highest power supply voltage. In that case, it is very difficult to generate a voltage reference above the highest power supply. However since this invention detects the lowest potential (low side) of the TXP and the TXN signals, which is below the highest potential voltage on the chip, the threshold detector is easy to implement.

In an example:

$$V peak = VCT = A, \text{ where } A = VTX * Zterm/(Zterm+1)$$

Normally Zload=Zterm. In that case, Vpeak=VCT+VTX/2. However, if Zterm is equal to Infinity (open circuit case), then Vpeak increases to VCT+VTX, which can overload the output device. While the positive (high) peak voltage increases, the "transformer" action causes the lower side peak voltage to decrease accordingly. Therefore, only one threshold level is required to detect an overload.

The output of the threshold detector can go to a digital signal processor (DSP) or a digital or other control circuit. The limit function does not need to be included in the line-driver 110 amplifier or pre-driver 114. In the case of an overload, the signal to the driver could be shunted outside the transmitter or elsewhere in the transmit data path.

An overload can also occur during fink-up. In 802.3, link-pulses are sent between phys. During an "auto-mdix" auto-negotiation, it is possible for two transceivers to be transmitting on the same pair of wires, causing the signal at the line-driver 110 to increase in amplitude as the two transmitting signals constructively interfere. This invention will also detect this case.

In addition, if the transformer has a voltage fault (an open VCT=0), then the integrated circuit will detect this condition therefore recognizing a problem at the transformer. A signal is then sent to the operator of the phy of the open transformer event.

As one of ordinary skill in the art will appreciate, various changes, substitutions, and alterations could be made or otherwise implemented without departing from the principles of the present invention. Accordingly, the examples and drawings disclosed herein including the appendix are for purposes of illustrating the preferred embodiments of the present invention and are not to be construed as limiting the invention.

What is claimed is:

1. A line driver circuit comprising:
   an output transistor on an integrated circuit chip, wherein the output transistor is configured to provide an output signal to a transformer coupled to a load, and wherein the output signal is configured to oscillate around a center tap voltage of the transformer; and
   an overload detector circuit on the integrated circuit chip, wherein the overload detector circuit is configured to:
      receive the output signal;
      compare a voltage of the output signal to a threshold voltage value; and
      generate a control signal to reduce a voltage amplitude of the output signal responsive to the voltage of the output signal being less than the threshold voltage value.

2. The line driver circuit of claim 1, wherein the output signal is configured to oscillate between a maximum voltage value and a minimum voltage value, and wherein the overload detector circuit is further configured to compare the minimum voltage value to the threshold voltage value.

3. The line driver circuit of claim 1, further comprising a predriver circuit on the integrated circuit chip, wherein the predriver circuit is coupled to a gate of the output transistor, and wherein the predriver circuit is configured to control a voltage on a gate of the output transistor to generate the output signal.

4. The line driver circuit of claim 3, wherein the predriver circuit is further configured to receive the control signal and reduce the voltage amplitude of the output signal.

5. The line driver circuit of claim 3, further comprising a digital signal processor (DSP) coupled to the predriver circuit, wherein the DSP is configured to receive the control signal and reduce the amplitude of the output signal.

6. The line driver circuit of claim 1, wherein the output signal comprises two complementary output signals, and wherein the line driver circuit further comprises:
   a first terminal configured to receive one of the complementary output signals;
   a second terminal configured to receive another of the complementary output signals; and
   a termination resistance between the first and second terminals.

7. The line driver circuit of claim 6, wherein, for the two complementary output signals, a maximum voltage value of the complementary signals is based, at least in part, on the termination resistance.

8. The line driver circuit of claim 6, wherein the output transistor comprises first and second output transistors, wherein the first output transistor is configured to generate one of the two complementary output signals, and wherein the second output transistor is configured to generate another of the two complementary output signals.

9. The line driver circuit of claim 1, wherein the comparison indicates overload if an impedance of the load substantially represents an infinite load.

10. A method for protecting a line driver circuit from overdrive, the method comprising:
    generating an output signal for a transformer coupled to a load, wherein the output signal oscillates around a center tap voltage of the transformer;
    comparing a voltage of the output signal to a threshold voltage value; and
    generating a control signal to reduce a voltage amplitude of the output signal responsive to the voltage of the output signal being less than the threshold voltage value.

11. The method of claim 10, wherein said generating an output signal and said comparing a voltage of the output signal to a threshold voltage value both occur on an integrated circuit chip.

12. The method of claim 10, wherein the output signal oscillates between a maximum voltage value and a minimum voltage value, and wherein said comparing the voltage of the output signal to a threshold voltage value comprises comparing the minimum voltage value of the output signal to the threshold voltage value.

13. The method of claim 10, wherein said generating an output signal for a transformer coupled to a load comprises controlling a voltage on a gate of an output transistor to generate the output signal.

14. The method of claim 13, further comprising providing the control signal to a predriver circuit coupled to the output transistor, wherein the predriver circuit is configured to reduce the voltage amplitude of the output signal in response to the control signal.

15. The method of claim 10, further comprising providing the control signal to a digital signal processor (DSP), and wherein the DSP is configured to reduce the voltage amplitude of the output signal in response to the control signal.

16. The method of claim 10, wherein the output signal comprises two complementary output signals, and wherein the method further comprises:
    providing one of the complementary output signals to a first end of a termination resistance; and
    providing another of the complementary output signals to a second end of the termination resistance.

17. The method of claim 16, wherein a maximum voltage value of the complementary signals is based, at least in part, on the termination resistance.

18. The method of claim 10, wherein the output signal is generated, at least in part, based on an incoming signal, and wherein the method further comprises shunting the incoming signal if the comparison indicates overload.

19. The method of claim 10, wherein the comparison indicates overload if an impedance of the load substantially represents an infinite load.

20. The method of claim 10, wherein the center tap voltage is a non-zero voltage.

* * * * *